United States Patent [19]
Ott

[11] Patent Number: 6,084,916
[45] Date of Patent: Jul. 4, 2000

[54] RECEIVER SAMPLE RATE FREQUENCY ADJUSTMENT FOR SAMPLE RATE CONVERSION BETWEEN ASYNCHRONOUS DIGITAL SYSTEMS

[75] Inventor: Stefan Ott, Munich, Germany

[73] Assignee: VLSI Technology, Inc., San Jose, Calif.

[21] Appl. No.: 08/892,302

[22] Filed: Jul. 14, 1997

[51] Int. Cl.[7] .................................................. H04L 25/00
[52] U.S. Cl. ........................ 375/259; 364/724.1; 341/61; 341/143
[58] Field of Search ..................................... 375/259, 241, 375/242, 377, 371; 341/61, 143, 144, 146, 126, 128, 129; 364/724.1, 474.3, 723

[56] References Cited

U.S. PATENT DOCUMENTS

| | | | |
|---|---|---|---|
| 5,309,484 | 5/1994 | McLane et al. | 375/106 |
| 5,457,456 | 10/1995 | Norsworthy et al. | 341/161 |
| 5,512,895 | 4/1996 | Madden et al. | 341/161 |
| 5,512,898 | 4/1996 | Norsworthy | 341/155 |
| 5,606,319 | 2/1997 | Yatim et al. | 341/144 |
| 5,712,635 | 1/1998 | Wilson et al. | 341/144 |
| 5,872,531 | 2/1999 | Johnson et al. | 341/110 |
| 5,892,694 | 4/1999 | Ott | 364/724.1 |

*Primary Examiner*—Chi H. Pham
*Assistant Examiner*—Emmanuel Bayard
*Attorney, Agent, or Firm*—Wagner, Murabito & Hao LLP

[57] ABSTRACT

The present invention comprises a sample rate conversion system for eliminating sample rate slippage. The system of the present invention includes a first sample rate conversion circuit and a second sample rate conversion circuit. The first sample rate conversion circuit is adapted to multiply a sample rate frequency by a factor "N", producing a first converted sample rate frequency. The a second sample rate conversion circuit is adapted to divide the first converted sample rate frequency by a factor of "M", producing a second converted sample rate frequency. The sample rate frequency is used to encode an input signal, producing an encoded signal. The second converted sample rate frequency is used to decode the encoded signal, producing an output signal. The second converted sample rate frequency and the values of N and M are adjusted such that the input signal is substantially the same as the output signal, eliminating sample rate slippage.

18 Claims, 8 Drawing Sheets

700

701 Receive a digital signal from a transmitter via a transmission link

702 Adjust the values of FR, N and M such that FR*M = FT*N, wherein FR is the variable within its specified tolerance range

703 Multiply the sample rate of the digital signal by N to generate a first converted sample rate

704 Divide the first converted sample rate of the digital signal by M to generate a second converted sample rate

705 Convert the digital signal into an analog signal using the second converted sample rate

706 Filter the analog signal to obtain an analog output signal having no sample slippage distortion

FIGURE 7

RECEIVER SAMPLE RATE FREQUENCY ADJUSTMENT FOR SAMPLE RATE CONVERSION BETWEEN ASYNCHRONOUS DIGITAL SYSTEMS

TECHNICAL FIELD

The present invention relates generally to digital information systems. More particularly, the present invention relates to a method and system for reducing signal distortions caused by asynchronous sample rates between digital information systems.

BACKGROUND ART

The transmission of digital information and data between systems has become an essential part of commonly used systems. With such systems, information content is transmitted and received in digital form as opposed to analog form. Information long associated with analog transmission techniques, for example, television, telephone, music, and other forms of audio and video, are now being transmitted and received in digital form. The digital form of the information allows signal processing techniques not practical with analog signals. In most applications, the user has no perception of the digital nature of the information being received.

Traditional modes of communication often occurred in "real time". For example, a telephone conversation occurred in real time. A "live" television sports broadcast occurred in real time. Users have come to expect these, and other such traditional forms of communication to be real time. Thus, digital transmission and reception techniques and systems need to provide for the real time transmission and reception of information.

There is a problem, however, in that digital communication between devices distant from each other usually precludes the availability of identical sampling frequencies. Except for those cases where a distinct clocking hierarchy structure can be defined and a common distributed clock source employed, there will be some difference between the sample rate of one device (e.g., the transmitter) from the other (e.g., the receiver).

Prior Art FIG. 1 shows a typical prior art digital information transmission and reception system 100. In system 100, a signal source 101, for example, a video camera, generates an analog input signal. The input signal is coupled to a sampler-ADC (analog to digital converter) 102, where it is sampled and encoded into a digital pulse code modulated signal. This signal is transmitted across a transmission link to a sampler 103. Sampler 103 is coupled to a DAC (digital to analog converter) reconstruction filter 104. The sampler 103 samples the pulse code modulated signal received via the transmission link. The sampling creates a digital signal, which is subsequently coupled to the DAC-reconstruction filter where it is decoded and filtered into an output signal. The output signal represents the input signal from signal source 101.

In system 100, as in other typical prior art digital transmission systems, the transmitter (sampler-ADC 102) and receiver (sampler 103 and DAC-reconstruction filter 104) operate at different sampling clock frequencies. Additionally, the ratio between the sampling clock frequency of sampler-ADC 102 and the sampling clock frequency of sampler 103 is a non-integer value. Hence, even though information is being transmitted at the same nominal sampling frequency, when the local clocks are not the same, there will usually be a slight difference in the actual sampling rates. As a result, sampling at the sending terminal (e.g., sampler-ADC 102) and reconstruction at the receiving terminal (e.g., DAC-reconstruction filter 104) is accomplished with a slight variance in the nominal sampling rates.

In addition, the sample rate frequencies may also vary over temperature, part scattering, and time. For clock ratios with a fractional part, a sample rate exists at which sample overruns or underruns at the receiver input will occur. Those overruns and underruns are hereafter referred to as sample slippage. Sample slippage generates objectionable distortion, for example, in the form of an audible click noise in audio transmissions and horizontal jitter in television systems. In some systems, the error due to slippage is cumulative and segments of transmitted information are backed-up and/or delayed. Over a period of time, such segments may eventually be periodically lost, especially if the system is designed to re-synchronize or to attempt to re-synchronize itself to real time or to a master clock.

Thus, what is required is a system for digital transmission which overcomes sample slippage limitations. The required system should provide for digital transmission and reception systems which eliminate sample slippage distortions. Additionally, the required system should function without requiring a large amount of computational power. The present invention provides a novel solution to the above requirements.

DISCLOSURE OF THE INVENTION

The present invention provides a system for digital transmission which overcomes the sample slippage limitations associated with the prior art. The system of the present invention provides for digital transmission and reception systems which eliminate sample slippage distortions. In addition, the system of the present invention functions nominally without requiring large amounts of computational power.

In one embodiment, the present invention comprises a sample rate conversion system for eliminating sample rate slippage. The system of the present invention includes a first sample rate conversion circuit and a second sample rate conversion circuit. The first sample rate conversion circuit is adapted to multiply a sample rate frequency of a received digital signal by a factor "N", producing a first converted sample rate frequency. The second sample rate conversion circuit is adapted to divide the first converted sample rate frequency by a factor of "M", producing a second converted sample rate frequency. The sample rate frequency is used to encode an analog input signal, producing a digital signal. The second converted sample rate frequency is used to decode the digital signal, producing an analog output signal. The second converted sample rate frequency and the values of N and M are adjusted such that the input signal is substantially the same as the output signal. The second converted sample rate frequency (e.g., the receiver sample rate frequency) is varied over a specified range (within the specified tolerances of the receiver) such that smaller values of M and N can be utilized. In so doing, the present invention eliminates sample slippage between the input signal and the output signal without requiring large amounts of computational power.

BRIEF DESCRIPTION OF THE DRAWINGS

The accompanying drawings, which are incorporated in and form a part of this specification, illustrate embodiments of the invention and, together with the description, serve to explain the principles of the invention:

Prior Art

FIG. 7 shows a flow chart of the steps of a process in accordance with one embodiment of the present invention.

BEST MODE FOR CARRYING OUT THE INVENTION

Reference will now be made in detail to the preferred embodiments of the invention, a sample rate conversion system for eliminating sample rate slippage, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present invention provides a system for digital transmission which overcomes the sample slippage limitations associated with the prior art. The system of the present invention provides for digital transmission and reception systems which eliminate sample slippage distortions. In addition, the system of the present invention functions nominally without requiring large amounts of computational power. The present invention and its benefits are further described below.

Figure 1:
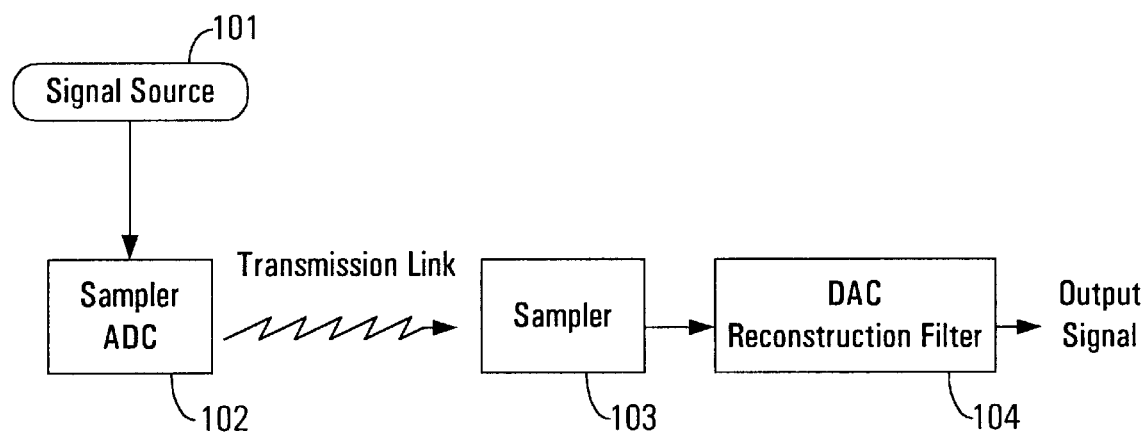
FIG. 1 shows a typical prior art digital information transmission and reception system.
Figure 2:
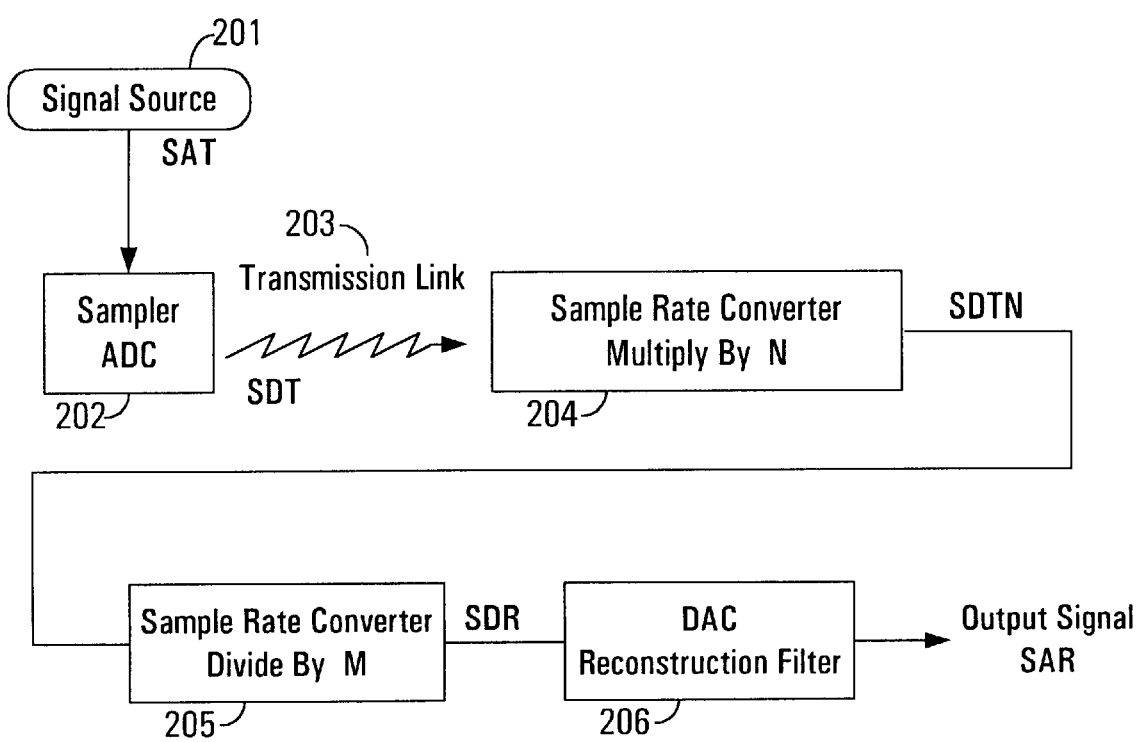
FIG. 2 shows a digital transmission and reception system in accordance with one embodiment of the present invention.

FIG. 2 shows a system 200 in accordance with one embodiment of the present invention. System 200 includes a signal source 201 coupled to a sampler ADC 202. The sampler ADC 202 is coupled via a transmission link 203 to a sample rate converter 204. Sample rate converter 204 is coupled to a sample rate converter 205 and a DAC reconstruction filter 206. System 200 functions by accepting an analog signal from signal source 201, converting it to a digital signal, transmitting the digital signal over transmission link 203, and reconstructing the digital signal as an output signal.

In the present embodiment, signal source 201 comprises a real time signal source, for example, a video camera, which captures real time information to be transmitted to a distant user. The analog signal emerging from signal source 201 is referred to as SAT (signal analog transmitted). SAT, being analog, is continuous in nature (e.g., not time discrete) and as such, has no sample rate to speak of. SAT is coupled to sampler ADC 202 as an input. The sampler ADC 202 functions by sampling SAT from signal source 201 into a digital pulse code modulated signal referred to as SDT (signal digital transmitted). SDT is subsequently transmitted through transmission link 203 to sample rate converter 204. SDT, being digital, is time discrete and has a sample rate in accordance with the sample rate of sampler ADC 202. This sample rate is referred to as FT (sampling frequency transmitter).

The sample rate converter 204 receives SDT and multiplies the sample rate FT by a variable factor "N". Thus, the signal emerging from sample rate converter 204 is a digital signal SDTN, which is the signal SDT having a sample rate of FT multiplied by N (i.e., sample rate of FTN). The signal SDTN is subsequently coupled to sample rate converter 205.

The sample rate converter 205 receives SDTN and divides the signal SDTN by a variable factor "M", yielding a digital signal with a sample rate FR divided by M, referred to as SDR (signal digital received). SDR is subsequently coupled to DAC reconstruction filter 206.

DAC reconstruction filter 206 converts the digital signal SDR from digital back to analog (e.g., decoding), and filters the resulting analog signal to remove unwanted high frequency components. The emerging signal, the output signal, is a copy of SAT from signal source 201. This signal is referred to as SAR (signal analog received).

Hence, system 200 functions by controlling the values of the factors N and M and the sample rate of the receiver FR such that the "effective" receiver sample rate is matched to the transmitter sample rate FT. By matching the effective receiver sampling rate to the transmitter sampling rate, system 200 eliminates the effects of sample slippage. Eliminating sample slippage allows system 200 to reconstruct the output signal SAR such that it is a copy of the input signal SAT, free of the sample slippage distortion common with prior art digital transmission systems.

Referring still to FIG. 2, system 200 functions using low-pass signals (e.g., SAR) however, the present invention can be similarly applied to band-pass signals. In the present embodiment, the signal SAT from analog source 201 is an analog low-pass signal having a useful bandwidth "BAT" for digital transmission. As SAT is sampled by sampler ADC 202, it becomes discrete with respect to time, which leads to the sample slippage problem. If FR≠FT, sample slippage will occur at a rate of FS=absolute value of (FR−FT), resulting in the intermittent loss of information. In addition to the loss of information, a phase noise, whose spectrum consists of an infinite number if spurious components every FS Hz, is introduced. The system of the present invention functions by eliminating the sample slippage between FT (the sample rate of the transmitter) and FR (the sample rate of the receiver) by matching the "effective" receiver sample rate to the transmitter sample rate.

System 200 functions by implementing the equation FRM=FR multiplied by M=FT multiplied by N=FTN. The first sample rate converter 204 and the second sample rate converter 205 act as a sample rate converter chain which manipulates the effective sample rate of the receiver such that it matches the sample rate of the transmitter.

In system 200, as in many systems, the sample rate of the transmitter (e.g., FT from sampler ADC 202) is fixed, in that it cannot be changed without adversely affecting all receivers of the signal being broadcast (e.g., SDT). Hence, FT needs to remain constant, at its specified level. However, changes in the sample rate of the receiver (eg., FR) affect only that particular receiver, and thus, can be adjusted within the receiver's tolerance range to eliminate sample slippage. The present invention provides a system which takes advantage of this tolerance range to eliminate sample slippage without requiring excessive computation power.

As described above, FR is the sample rate of the receiver and FT is the sample rate of the transmitter. The first sample rate converter (e.g., sample rate converter 204) is a "multiply by N" sample rate converter which multiplies the sample rate FT of SDT (after lossless transmission) by N, yielding sample rate FTN and the signal SDTN. The second sample rate converter (e.g., sample rate converter 205) is a "divide by M" sample rate converter which divides the rate FRM of SDTN by M, yielding the signal SDR, having the sample rate FR. SDR is converted back to analog and filtered to bandwidth BAT, yielding the output signal SAR, which is a copy of the source signal SAT.

Figure 3:
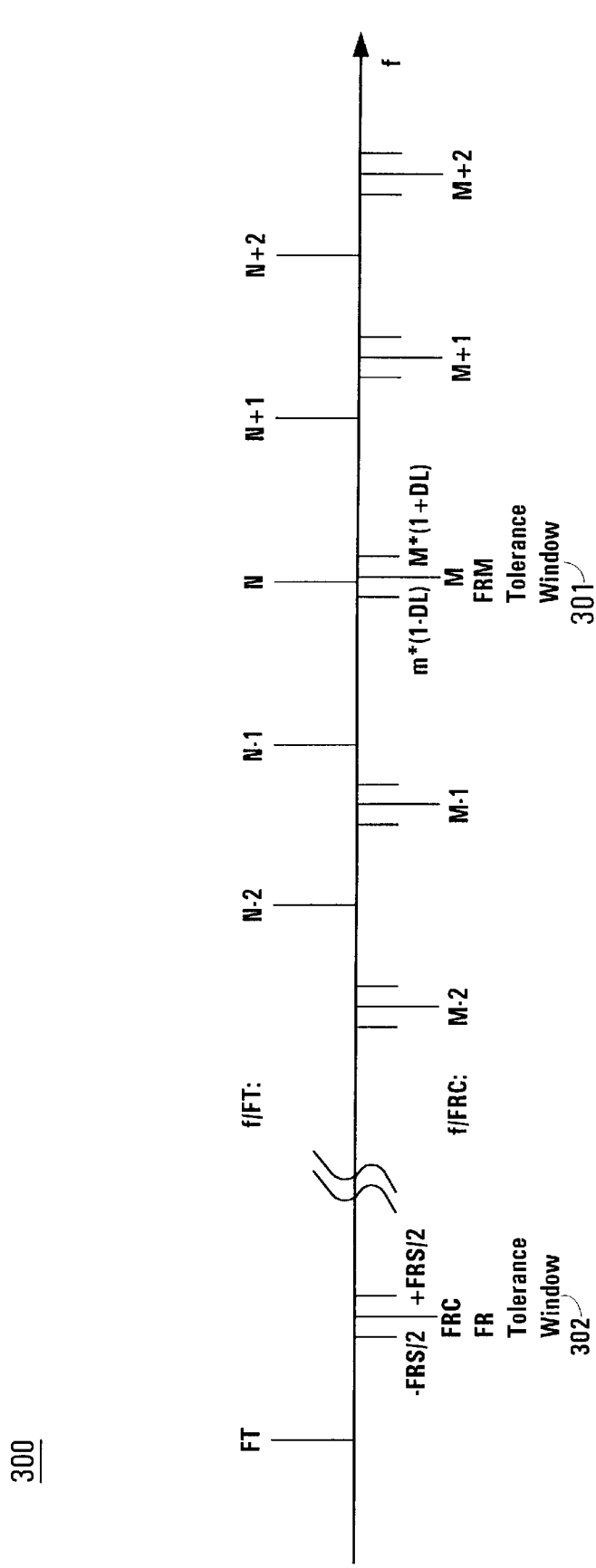
FIG. 3 shows a graph illustrating the relationship between the sample rate of a transmitter FT, the sample rate of a receiver FR, and the factors N and M, in accordance with the present invention.

Referring still to FIG. 2, assuming that FR≠FT, two integer numbers, M and N, can be computed that meet the equation FRM=FR multiplied by M=FT multiplied by N=FTN. A trivial solution is N=FR and M=FT. Note that sample slippage will not occur. However, this is usually impractical as M and N will be very large (as shown by FIG. 3) and very expensive to compute in real time.

The present invention takes advantage of the fact that the sample rate of the receiver FR need not be fixed. FR can vary, as long as it remains within the specified frequency tolerance. Thus, FR is only required to be within a span FRS around a center frequency FRC. Frequencies within this range can be described by:

$FR=FRC \pm FRS/2$, or;  Equation 1

$FR=FRC$ multiplied by $(1 \pm DL)$, where $DL=FRS/FRC/2$. Equation 2

DL represents a residual frequency error that is tolerated by the specifications of a given system. Given this extra degree of freedom, it is now possible to compute a solution for M, N, and D that meets the equation:

$FRM=FR$ multiplied by $(1+D)$ multiplied by $M=FT$ multiplied by $N=FTN$, where $-DL \leq D \leq DL$.  Equation 3

This is equivalent to the relation:

absolute value of$((FT$ multiplied by $N/FR$ multiplied by $M)-1) \leq DL$.  Equation 4

DL represents a frequency "window" that has to be "hit" by selecting proper values for M and N. The following algorithm, for example, is a sample determination of suitable values for M and N:

(1) setN=1.
(2) compute M=FT multiplied by N/FR.
(3) compute D=(FT multiplied by N)/(FR multiplied by M)−1

(4) if the absolute value of D is≦DL, a solution has been found, else increase N by 1 and continue with (6).

With reference now to FIG. 3, a graph 300 illustrating the relationship between the sample rate of the transmitter FT, the sample rate of the receiver FR, and the factors N and M, is shown. Graph 300 shows frequency in the horizontal direction, increasing from left to right. FT and FTN are on the upper side of graph 300. FR and FRM are on the lower side.

As described above, the frequency FT is fixed. The value of FR and the factors M and N are varied such that FTN falls within the tolerance widow M(1−DL) and M(1+DL). Several "adjacent" values of N and M are shown on the upper and lower side of graph 300. It should be noted that, as shown, N and M are chosen such that FTN falls within the tolerance widow 301. The adjacent values of FTN are shown as N−2, N−1, N+1, and N+2, while the adjacent values of FRM are shown as M−2, M−1, M+1, and M+2. Hence, FR is varied about FRC within its tolerance widow 302, until FRM and tolerance widow 301 line up with FTN. It should be noted that by varying FR within tolerance window 302, lower values (integer) of M and N can be computed which satisfy equation 4. If FR could not be varied, M and N would likely be much larger in comparison to FR and FT.

Figure 4A:
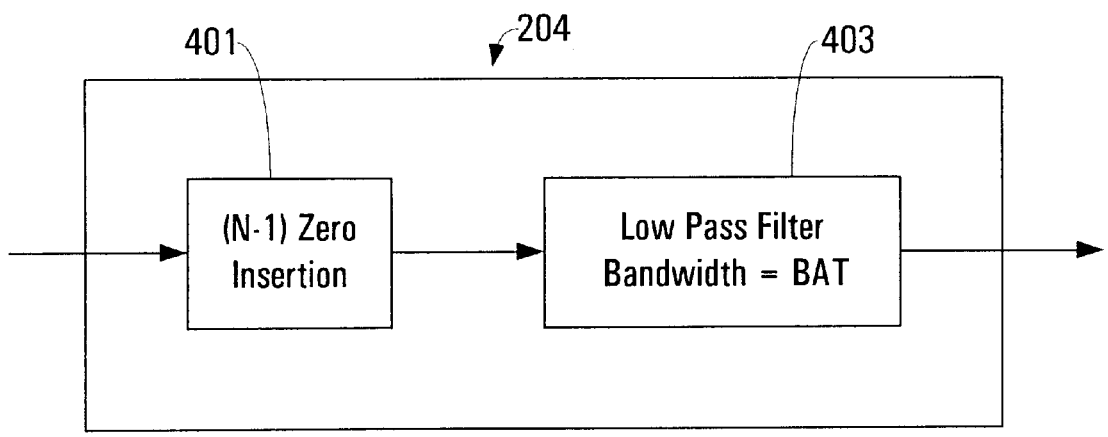
FIG. 4A shows the first sample rate converter (e.g., multiply by N) from FIG. 2 in greater detail.
Figure 4B:
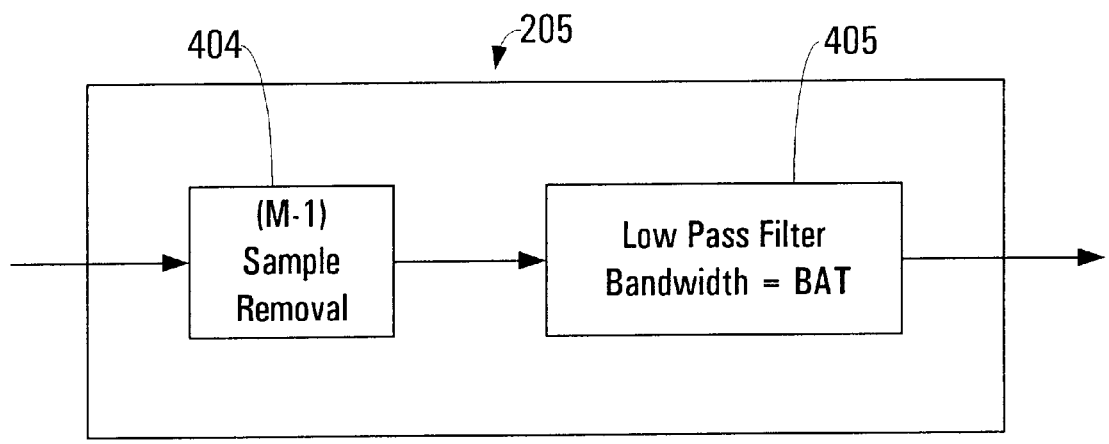
FIG. 4B shows the second sample rate converter (e.g., divide by M) from FIG. 2 in greater detail.

Referring now to FIG. 4A and FIG. 4B, the sample rate converter 24 and sample rate converter 205 are shown in greater detail. Sample rate converter 204 includes an (N−1) zero insertion circuit 401 which is serially connected to a low pass filter bandwidth BAT circuit 403. Similarly, sample rate converter 205 includes a (M−1) sample removal circuit 404 which is serially connected to a low pass filter bandwidth BAT circuit 405. The effect of sample rate converter 204 is shown in detail in FIG. 5 below.

Figure 5:
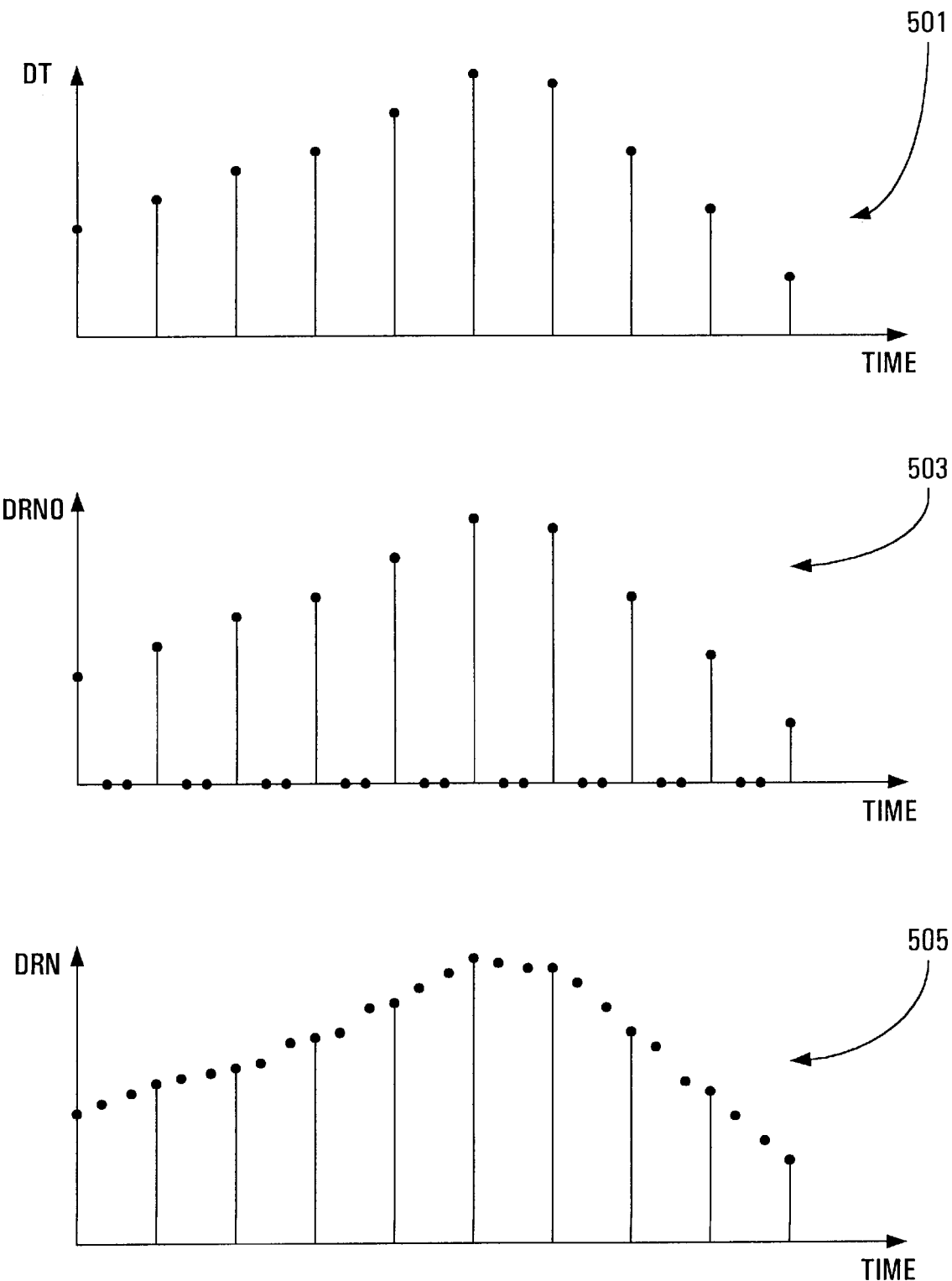
FIG. 5 shows the signal SDT from FIG. 2 in greater detail.

FIG. 5 shows the signal SDT, which is comprised of ten discrete samples 501 in the present example, applied to sample rate converter 204. SDT is interpolated at an interpolation ratio "N" (e.g., factor N). The interpolation ratio N is selected as the numeral "3" in the present example, although higher selected numerals for N are more effective as hereinafter explained. SDT is interpolated by inserting (N−1), i.e., "2" in the present example, zero-valued samples 503 between each of the ten samples of SDT as illustrated. The frequency domain characteristics of the input signal are unaltered by this operation except that the zero-padded sequence is considered to be sampled at a frequency which is the product of the original sampling frequency FT multiplied by the interpolation ratio "N".

The zero-padded values are fed into low pass filter bandwidth BAT circuit 403 which is comprised, for example, of a digital FIR low-pass filter to smooth or integrate the sequence, and limit the bandwidth of the filter bandwidth to 20 KHz for example. At that point, the interpolated signal has been quantitized to a much finer time scale than the original sequence. The interpolated sequence is then passed to a zero-order hold functional block, which may be implemented by a register, and then synchronously resampled at the output sample frequency. The resampling can be considered a decimation operation since only a very few samples out of the great many interpolated samples are retained. The output values represent the "nearest" values produced by the interpolation operation. There is always some variance in the output sample amplitude due to the fact that the output sampling switch does not close at a time that exactly corresponds to a point on the fine time scale of the interpolated sequence. However, that variance can be made arbitrarily small by using a large interpolation ratio N. The resultant sampled values are depicted by samples 505 of FIG. 4.

It should be noted that the sample removal circuit 404 and low pass filter 405 function in a similar manner except that M−1 samples are removed from the samples of the signal as opposed to being added. The removal of the M−1 samples effects a division of the sample rate as opposed to the multiplication described above.

Figure 6A:
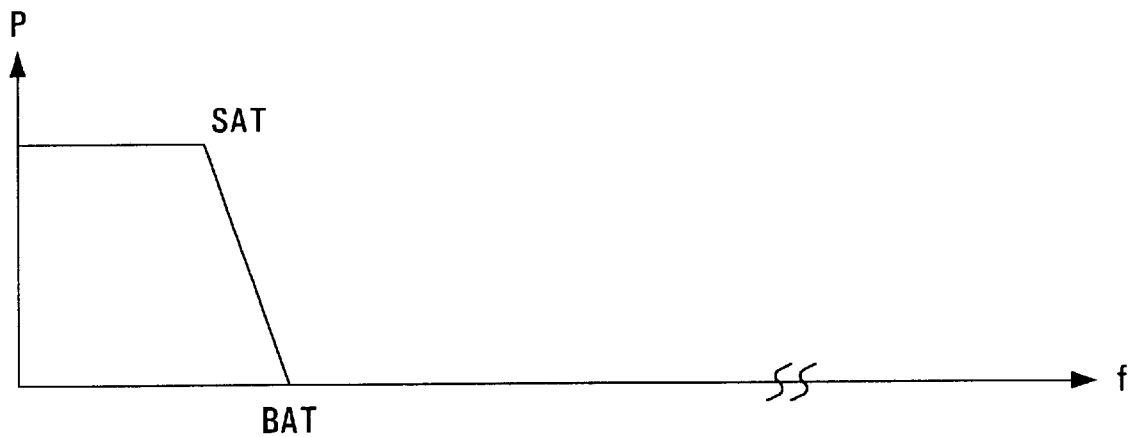
FIG. 6A shows a frequency-power graph of the signal SAT from one embodiment of the present invention.
Figure 6B:
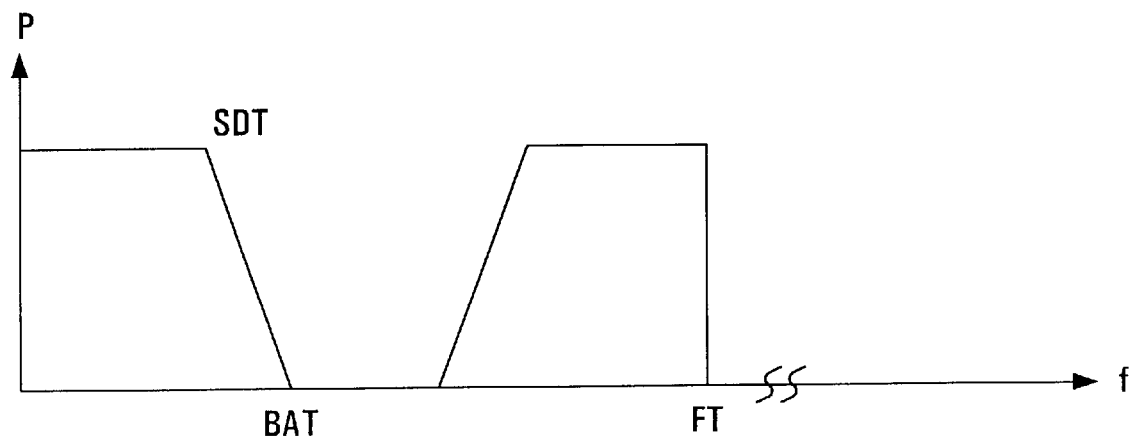
FIG. 6B shows a frequency-power graph of the signals SDT and FT from one embodiment of the present invention.
Figure 6C:
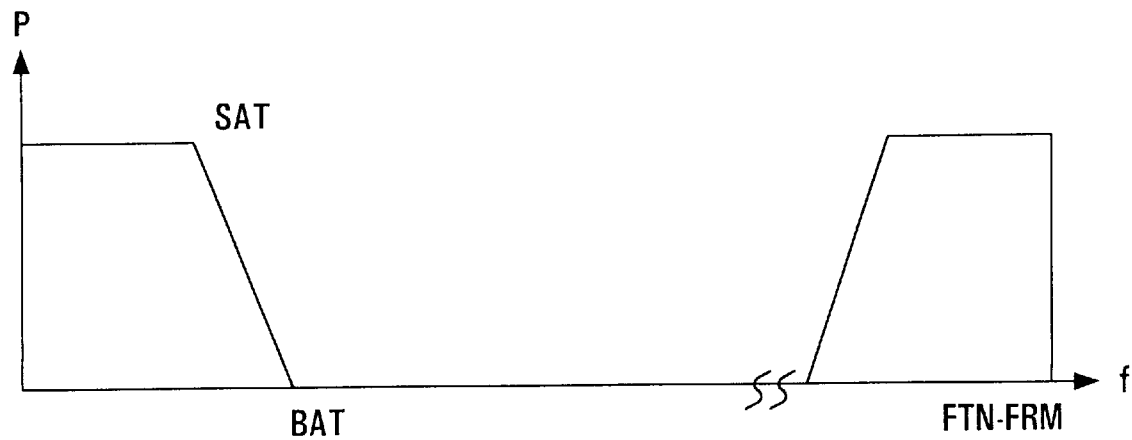
FIG. 6C shows a frequency-power graph of the signals SAT, FTN, and FTM from one embodiment of the present invention.
Figure 6D:
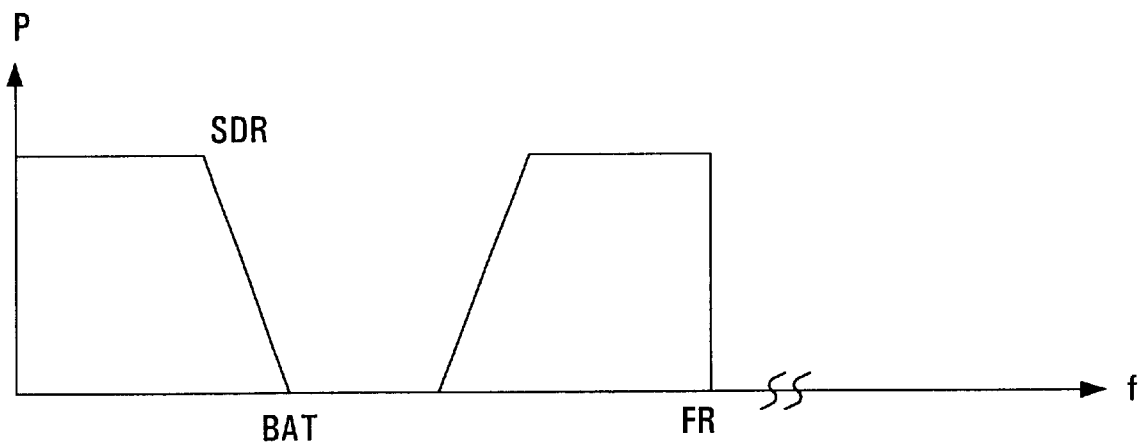
FIG. 6D shows a frequency-power graph of the signals SDR and FR from one embodiment of the present invention.
Figure 6E:
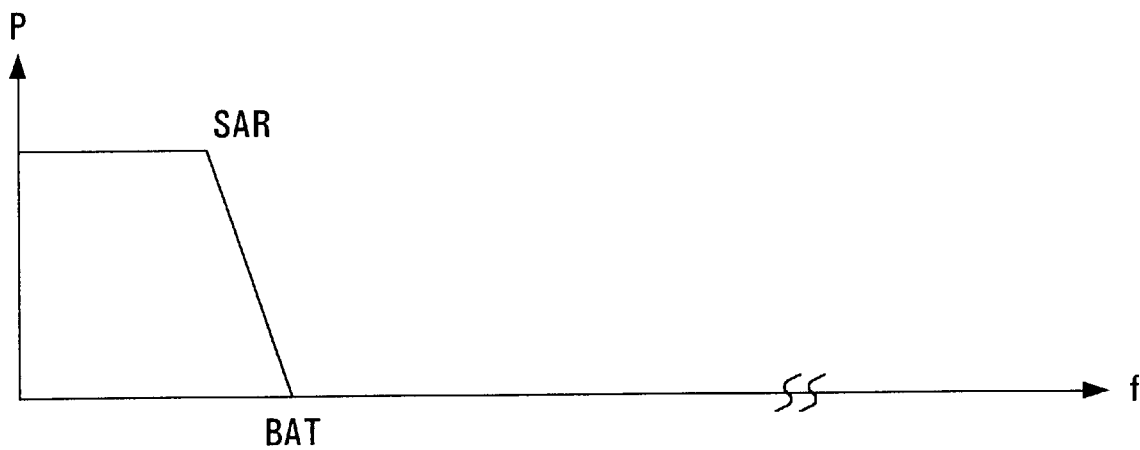
FIG. 6E shows a frequency-power graph of the signal SAR from one embodiment of the present invention.

FIGS. 6A, 6B, 6C, 6D, and 6E show the frequency spectra charts for various signal stages within system 200, including frequency spectra for signals SAT, SDT, SDTN, FTN/FRM, SDR, FR, and SAR for a value of N. As in FIG. 6A, the source signal SAT includes frequency components within the band BAT. As shown in FIG. 6B, after being sampled, the frequency range for the signal SDT includes an upper band or lobe at the frequency FT. As shown in FIG. 6C, at the point after the transmitted signal SDT is received and converted by sample rate converter 204 to provide the SDTN signal, the frequency spectrum has widened to FTN/FRM. If N had been chosen to be a higher value, i.e. N=2 rather than N=1, the frequency spectrum for the SDTN signal would be of a higher bandwidth FTN-FTM, with the sampling lobes spaced farther apart. Hence, FIG. 6D shows the FR lobe being closer to the SDR lobe. In effect, the higher the value of N, the greater the bandwidth over which the sampling noise will be distributed and the lower the density of the noise at any given frequency within the band. In FIG. 6E, as the SDR signal emerges from sample rate converter 205 and passes through DAC reconstruction filter 206, which provides output signal SAR, the frequency spectrum changes as shown. The effect of low pass filter bandwidth BAT 405 is to eliminate the upper frequency band FTN/FRM from FIG. 6C and provide output signal SAR.

Referring now to FIG. 7, a flowchart of the steps of a process 700 in accordance with one embodiment of the present invention is shown. Process 700 begins in step 701, where a digital signal from a transmitter is received via a transmission link. As described above, the digital signal is a digitized version of an analog input signal (e.g., SAR from FIG. 2). The analog input signal is converted from analog to digital (i.e., encoded) using a sampler ADC (e.g., sampler ADC 202), transmitted via a transmission link, and subsequently received by a receiver in accordance with the present invention.

In step 702, the present invention adjusts the values of FR, N, and M such that FR multiplied by M equals FT multiplied by N. As described above, FR is the sample rate of the receiver and M and N are integer numbers greater than one. The sample rate FR of the receiver is variable over a range defined by the specifications of the receiver. The system of the present invention utilizes this range, varying FR, such that smaller values of N and M can be computed which satisfy the relationship described above. This allows the system of the present invention to function without requiring large amounts of computational power.

In step 703, the present invention multiplies the sample rate of the digital signal by the factor N to generate a first converted sample rate. The sample rate of the digital signal received in step 701 is multiplied by N using a first sample rate converter (e.g., sample rate converter 204). This yields the first converted sample rate (e.g., FTN).

In step 704, the present invention multiplies the first converted sample rate of the digital signal by the factor M to generate the second converted sample rate. The first converted sample rate generated by the first sample rate converter is divided by the factor M using a second sample rate converter (e.g., sample rate converter 205). This yields the second converted sample rate (e.g., FR).

In step 705, the present invention converts the digital signal received in step 701 into an analog signal using the second converted sample rate. The second converted sample rate (e.g., FR) is used by a DAC to convert the digital signal from digital back to analog (e.g., decode).

In step 706, the analog signal is filtered to obtain an analog output signal having no sample slippage distortion. As described above, the DAC decodes the digital signal to produce the analog signal. This analog signal is subsequently filtered, removing the high frequency components, to reconstruct an output analog signal. The output analog signal, in accordance with the present invention, is a copy of the input analog signal described in step 701, and hence, is free from sample slippage distortion.

Thus, the present invention provides a system for digital transmission which overcomes the sample slippage limitations associated with the prior art. The system of the present invention provides for digital transmission and reception systems which eliminate sample slippage distortions. In addition, the system of the present invention functions nominally without requiring large amounts of computational power.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A sample rate conversion system for eliminating sample rate slippage, comprising:

a first sample rate conversion circuit adapted to multiply a sampling rate by a factor "N", producing a first converted sampling rate; and a second sample rate conversion circuit adapted to divide said first converted sampling rate by a factor of "M", producing a second converted sampling rate, said second converted sampling rate adjusted and the value of N and M adjusted to match said first sample rate with said second converted sampling rate such that an analog input signal encoded using said sampling rate to produce a digital signal is substantially the same as an analog output signal decoded from said digital signal using said second converted sampling rate.

2. The system of claim 1, wherein said factor N and said factor M are integer numbers.

3. The system of claim 2, wherein said second converted sampling rate is adjusted within a tolerance window, said tolerance window having an upper frequency limit and a lower frequency limit, said second converted sampling rate adjusted within said tolerance window such that lower values of M and N are utilized to effect said second converted sampling rate being substantially the same as said sampling rate.

4. The system of claim 1, wherein said first sample rate conversion circuit is adapted to receive said digital signal, said digital signal encoded from said analog input signal using said sampling rate, said digital signal received via a transmission link.

5. The system of claim 1, further comprising:

a sample insertion circuit included within said first sample rate converter, said sample insertion circuit adapted to insert additional samples as N−1 samples between each pair of samples of said digital signal such that said sampling rate is multiplied by said factor N.

6. The system of claim 1, further comprising:

a sample removal circuit included within said second sample rate converter, said sample removal circuit adapted to remove samples as M−1 samples of said digital signal such that said first converted sampling rate is divided by said factor M.

7. The system of claim 1, further comprising:

a reconstruction filter adapted to remove higher frequency components from said analog output signal such that said analog output signal is substantially the same as said analog input signal.

8. A signal processing system for processing a received digital signal to remove sample slippage distortion, comprising:

a sampler circuit adapted to convert an analog input signal into a first digital signal, said sampler circuit using a sampling rate for conversion;

a transmitter adapted to transmit said first digital signal;

a receiver adapted to receive said first digital signal;

a first sample rate conversion circuit adapted to multiply said sampling rate of said first digital signal by a factor "N", producing a second digital signal having a first converted sampling rate;

a second sample rate conversion circuit adapted to divide said first converted sampling rate of said second digital signal by a factor "M", producing a third digital signal having a second converted sampling rate wherein said sampling rate from said first sampler circuit matches said second converted sampling rate from said second sample rate conversion circuit;

a digital to analog converter adapted to convert said third digital signal into an output analog signal using said second converted sampling rate; and a reconstruction filter adapted to filter said output analog signal, said second converted sampling rate adjusted and the value of N and M adjusted such that said analog input signal is substantially the same as said analog output signal from said reconstruction filter.

9. The system of claim 8, wherein said factor N and said factor M are integer numbers.

10. The system of claim 9, wherein said second converted sampling rate is adjusted within a tolerance window, said tolerance window having an upper frequency limit and a lower frequency limit, said second converted sampling rate adjusted within said tolerance window such that lower values of M and N are utilized to effect said analog output signal being substantially the same as said analog input signal.

11. The system of claim 8, further comprising:

a sample insertion circuit included within said first sample rate conversion circuit, said sample insertion circuit adapted to insert additional samples as N−1 samples between each pair of samples of said first digital signal such that said sampling rate is multiplied by said factor N.

12. The system of claim 8, further comprising:

a sample removal circuit included within said second sample rate conversion circuit, said sample removal circuit adapted to remove samples as M−1 samples of said second digital signal such that said first converted sampling rate is divided by said factor M.

13. The system of claim 8, wherein said reconstruction filter is adapted to remove higher frequency components from said analog output signal such that said analog output signal is substantially the same as said analog input signal.

14. The system of claim 8, wherein said factor N is an integer number greater than 1.

15. The system of claim 8, wherein said factor M is an integer number greater than 1.

16. In a signal processing system for processing a received digital signal, a process for eliminating sample slippage distortion, the process comprising the steps of:

a) receiving a digital signal having a transmitter sample rate;

b) computing a value for a factor "M" and a factor "N" such that a receiver sample rate multiplied by said factor M equals said transmitter sample rate multiplied by said factor N, wherein said receiver sample rate is variable over a tolerance range;

c) multiplying said transmitter sample rate of said digital signal by said factor N to produce a first converted sample rate;

d) dividing said first converted sample rate by said factor M to produce a second converted sample rate to match said transmitter sample rate with said second converted sampling rate;

e) converting said digital signal into an analog output signal using said second converted sample rate; and f) filtering said analog output signal to obtain an analog output signal having no sample slippage distortion.

17. The process of claim 16, wherein step b) further includes computing a value for said factor M and said factor N wherein said factor M and said factor N are each integer numbers greater than 1.

18. The process of claim 17, further including the step of adjusting said receiver sample rate over a tolerance range such that lower values of said factors M and N effect said analog output signal having no sample slippage distortion.

* * * * *